United States Patent [19]
Levitt

[11] Patent Number: 5,787,012
[45] Date of Patent: Jul. 28, 1998

[54] INTEGRATED CIRCUIT WITH IDENTIFICATION SIGNAL WRITING CIRCUITRY DISTRIBUTED ON MULTIPLE METAL LAYERS

[75] Inventor: Marc E. Levitt, Sunnyvale, Calif.

[73] Assignee: Sun Microsystems, Inc., Mountain View, Calif.

[21] Appl. No.: 560,040

[22] Filed: Nov. 17, 1995

[51] Int. Cl.⁶ .................... G06F 17/50; G01R 31/3177
[52] U.S. Cl. .............. 364/490; 364/468.22; 364/468.23; 364/491; 324/66; 324/67; 324/763; 324/764
[58] Field of Search ................... 257/531, 692; 382/145, 8; 250/271; 362/287; 364/488–491, 578, 468.22, 468.23, 469.03, 469.04; 395/133; 324/764, 763, 66, 67; 252/965

[56] References Cited

U.S. PATENT DOCUMENTS

| | | | |
|---|---|---|---|
| 5,086,477 | 2/1992 | Yu et al. | 382/8 |
| 5,483,461 | 1/1996 | Lee et al. | 364/490 |
| 5,581,475 | 12/1996 | Majors | 364/491 |
| 5,689,432 | 11/1997 | Blaauw et al. | 364/490 |

OTHER PUBLICATIONS

Satish ("Tutorial on design for testability (DFT) 'An ASIC design philosophy for testablity from chips to systems'", IEEE, Proceedings of the Sixth Annual IEEE International ASIC Conference and Exhibit, 27 Sep. 1993, pp. 130–139).

Martin et al. ("A CAD tool for circuit extraction from VLSI layout cells", IEEE, Southeastcon 1989 Proceedings on Energy and Information Technologies in the Southeast, 9–12 Apr. 1989, pp. 817–820).

Primary Examiner—James P. Trammell
Assistant Examiner—Phallaka Kik
Attorney, Agent, or Firm—William S. Galliani; Flehr Hohbach Test Albritton & Herbert LLP

[57] ABSTRACT

An integrated circuit includes a first metal layer with first layer identification signal writing circuitry connections to produce first metal layer circuit identification signals. The integrated circuit also has a second metal layer with second layer identification signal writing circuitry connections to produce second metal layer circuit identification signals. Logic circuitry in the first metal layer has input connections to the first layer identification signal writing circuitry connections and the second layer identification signal writing circuitry connections. The logic circuitry combines the first metal layer circuit identification signals and the second metal layer circuit identification signals to produce a circuit identification number. The value of the circuit identification number can be changed by altering the first layer identification signal writing circuitry connectors or the second layer identification signal writing circuitry connections. Thus, the value of the circuit identification number can be easily changed at the metal layer at which revisions are made.

20 Claims, 6 Drawing Sheets

INTEGRATED CIRCUIT WITH IDENTIFICATION SIGNAL WRITING CIRCUITRY DISTRIBUTED ON MULTIPLE METAL LAYERS

BRIEF DESCRIPTION OF THE INVENTION

This invention relates generally to integrated circuits that utilize circuit identification numbers. More particularly, this invention relates to identification signal writing circuitry distributed on multiple metal layers of an integrated circuit to generate a circuit identification number.

BACKGROUND OF THE INVENTION

FIG. 1 illustrates a multiple metal layer integrated circuit 20 positioned in an integrated circuit package 22. The integrated circuit package 22 includes package pins 24. Electrical connections (not shown) are established between the package pins 24 and the integrated circuit 20 through conventional means, such as wire bonding. The package pins 24 are connected to a circuit board (not shown), which typically forms a portion of a general purpose computer. Thus, signals from the circuit board can be received at the package pins 24, processed by the integrated circuit 20 to produce output signals, which are then passed through the package pins 24 to the circuit board for subsequent processing.

The integrated circuit 20 is a multiple metal layer integrated circuit including a first metal layer M1, a second metal layer M2, and a third metal layer M3. Insulating layers 26 are positioned between each metal layer. Each insulating layer 26 includes vias 28 to electrically connect selected signals from one metal layer to another.

FIG. 2 is a plan view of the first metal layer M1 shown in FIG. 1. As used throughout this application, the term metal layer refers to any horizontal plane of an integrated circuit that includes metal interconnect (or any other conductive interconnect). The term metal layer also refers to any horizontal plane of an integrated circuit that is conductive.

The first metal layer M1 of FIG. 2 includes M1 logic circuitry 30. The M1 logic circuitry includes a set of transistors with metal interconnect positioned therebetween. The M1 logic circuitry executes a portion of the logical operations performed by the integrated circuit 20. The first metal layer M1 also includes identification registers 32. Identification registers store circuit identification numbers. For example, most complex integrated circuits have an identification number, similar to the serial number visibly apparent on consumer articles such as televisions. Standard techniques allow one to access the identification register of an integrated circuit to obtain information regarding the integrated circuit. The IEEE standard 1149.1 (JTAG) is an example of one technique used to access and process information in identification registers. The JTAG standard requires an identification register with four bits assigned to a version number. As its name implies, the version number of an identification number specifies a version for an integrated circuit. During the design and debug process, an integrated circuit will go through a number of versions. Thus, one must be able to distinguish between different versions or revisions of an integrated circuit design. In addition to observing the JTAG standard, many chip manufacturers provide additional identification registers for specifying additional integrated circuit information, including version information.

In the prior art, values are written into the identification registers 32 with single layer identification signal writing circuitry 34. The circuitry 34 establishes a set of hardwired connections to generate binary values for the identification registers 32.

The problem with the prior art approach of writing values to identification registers is that each time a circuit is revised, a new version number must be hardwired into the circuit. Suppose that the circuitry on the second metal layer M2 is changed during a design operation, resulting in a new version of the circuit. In this case, the masks for the second metal layer M2 must be changed and subsequently tested. In addition, because the version information of an identification signal stored in an identification register must be changed, the masks for the first metal layer M1, which includes the single layer identification signal writing circuitry 34, must also be changed and subsequently tested.

Thus, the single layer identification signal writing circuitry 34 of the prior art presents a substantive problem every time changes are made at metal layers that do not include the signal writing circuitry 34. Modern integrated circuits commonly include 3-5 metal layers. Consequently, a change at any single metal layer typically requires an additional change at the metal layer containing the signal writing circuitry 34. The processing and subsequent testing associated with this process is time consuming and expensive. Thus, it would be highly desirable to provide an integrated circuit and method that obviates the need for multiple metal layer design changes every time a single metal layer design change is necessary.

SUMMARY OF THE INVENTION

An integrated circuit includes a first metal layer with first layer identification signal writing circuitry connections to produce first metal layer circuit identification signals. The integrated circuit also has a second metal layer with second layer identification signal writing circuitry connections to produce second metal layer circuit identification signals. Logic circuitry in the first metal layer has input connections to the first layer identification signal writing circuitry connections and the second layer identification signal writing circuitry connections. The logic circuitry combines the first metal layer circuit identification signals and the second metal layer circuit identification signals to produce a circuit identification number. The value of the circuit identification number can be changed by altering the first layer identification signal writing circuitry connections or the second layer identification signal writing circuitry connections.

Thus, unlike the prior art which may require mask modifications on a number of metal layers to change a circuit identification number, the value of the circuit identification number in the present invention can be easily changed at the single metal layer at which revisions are made. The invention is implemented with simple and flexible electrical connections and minimal additional logic.

BRIEF DESCRIPTION OF THE DRAWINGS

For a better understanding of the nature and objects of the invention, reference should be made to the following detailed description taken in conjunction with the accompanying drawings, in which.

Like reference numerals refer to corresponding parts throughout the several views of the drawings.

DETAILED DESCRIPTION OF THE INVENTION

Figure 1:
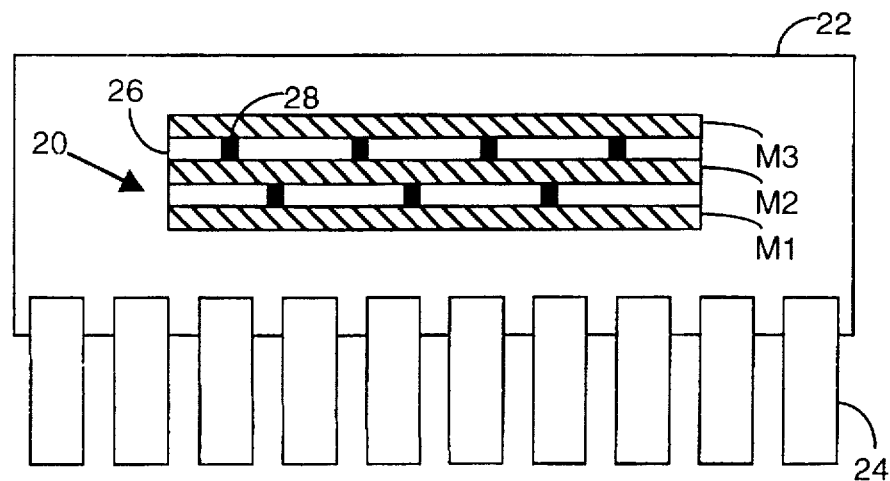
FIG. 1 is a cross-sectional view of a multiple metal layer integrated circuit positioned in an integrated circuit package.
Figure 2:
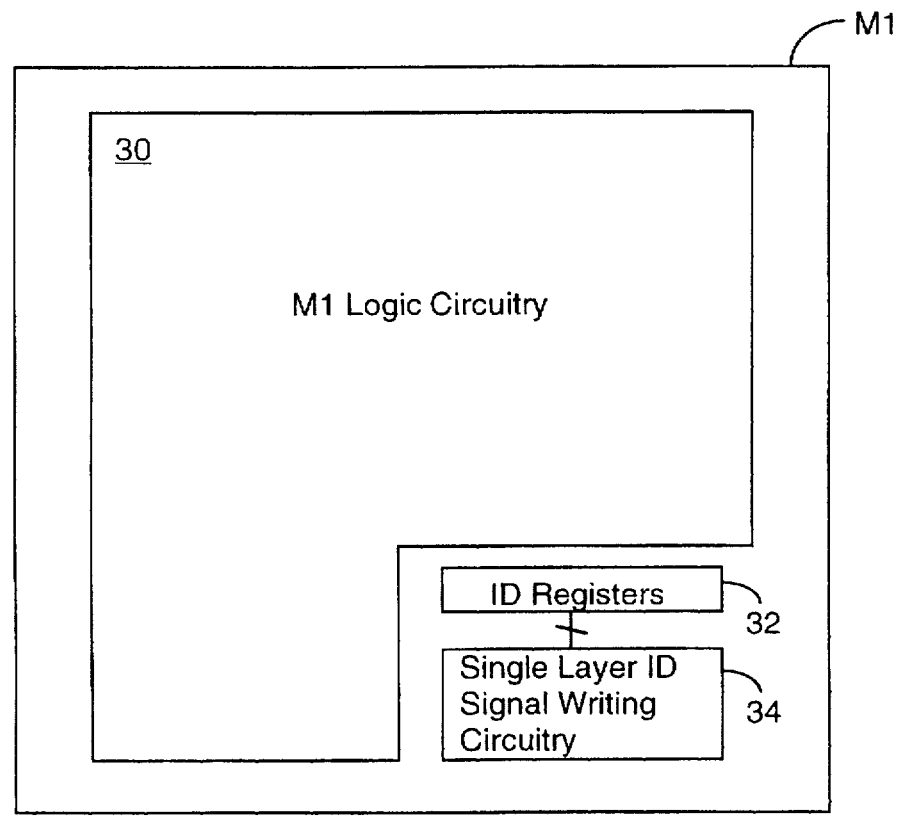
FIG. 2 is a simplified plan view of the first metal layer of the integrated circuit of FIG. 1, showing single layer identification signal writing circuitry to produce a circuit identification number for storage in an identification register.
Figure 3:
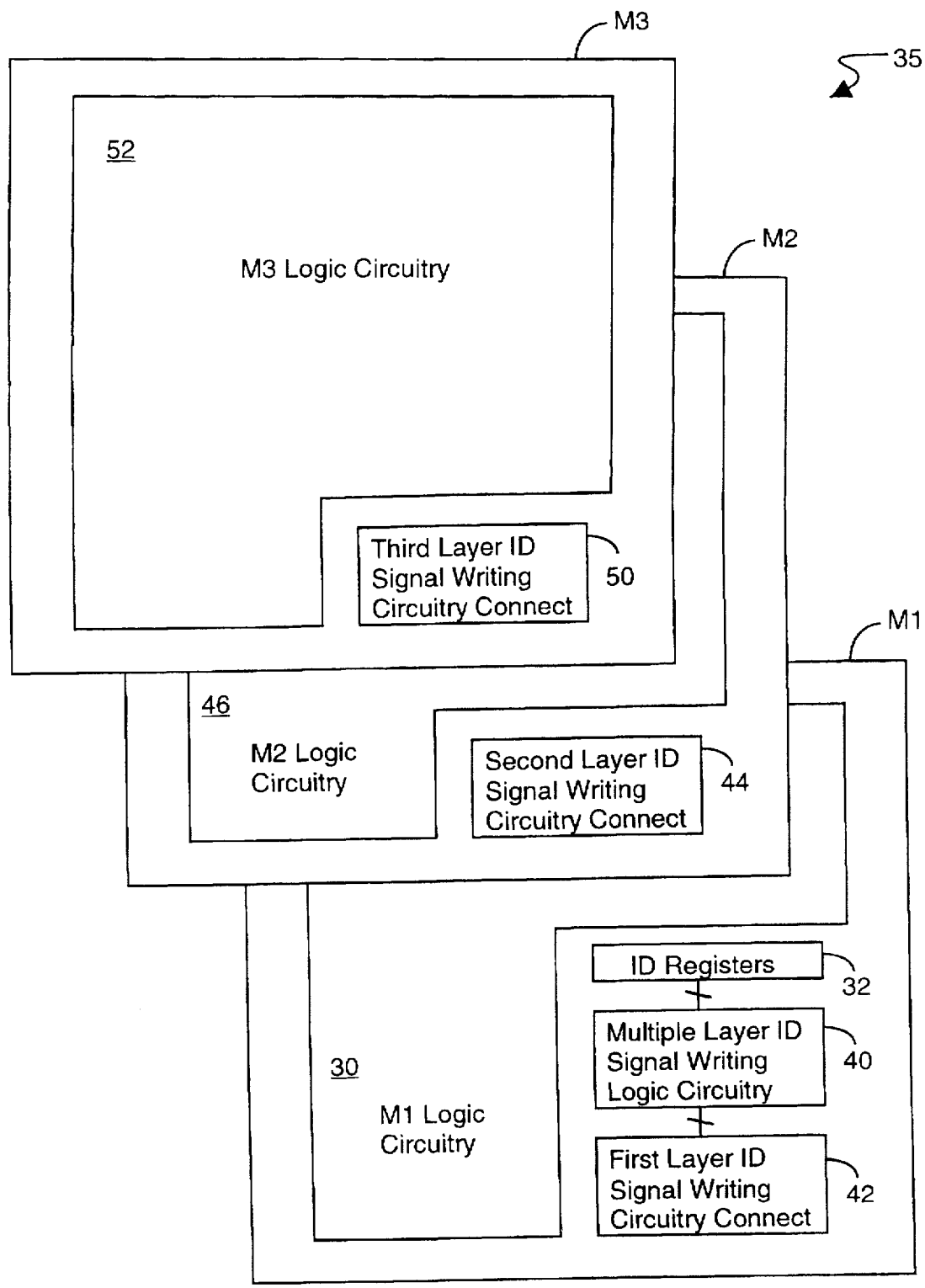
FIG. 3 illustrates identification signal writing circuitry distributed on multiple metal layers in accordance with one embodiment of the invention.

FIG. 3 illustrates the distributed identification signal writing circuitry utilized in accordance with the invention. The distributed approach of the invention allows a circuit identification signal, including a version number, to be changed at any metal layer. Thus, when design changes need to be made at only a single metal layer, the circuit identification signal can be changed locally at that metal layer, thereby obviating design changes at an additional metal layer. This highly desirable functionality is achieved with simple and flexible electrical connections and minimal additional logic.

In FIG. 3, the first metal layer M1 includes M1 logic circuitry 30 and identification registers 32 in accordance with prior art configurations. However, the first metal layer M1 also includes multiple layer identification signal writing logic circuitry 40. This circuitry is used to combine signals received from each of the metal layers, as will be described below. The first metal layer M1 also includes first layer identification signal writing circuitry connections 42. The signal writing connections 42 are used to generate first metal layer signals that are combined, by the signal writing logic circuitry 40, with signals from the other metal layers. Even though the signal writing logic circuitry 40 processes signals from multiple metal layers, it is important to note that in accordance with the invention, changing the values of signals at any single metal layer is sufficient to change the output of the signal writing logic circuitry 40. That is, changing the values of signals at any single metal layer is sufficient to generate a desired circuit identification number for storage in an identification register 32.

The second metal layer M2 has a similar configuration as the first metal layer M1. That is, the second metal layer M2 includes M2 logic circuitry 46 and second layer identification signal writing circuitry connections 44. The signal writing circuitry connections 44 are used to generate second metal layer signals that are combined, by the signal writing logic circuitry 40, with signals from the other metal layers. It is important to note that changing the values generated by the signal writing circuitry connections 44 of the second metal layer is sufficient to change the value of the circuit identification number produced by the signal writing logic circuitry 40.

The third metal layer M3 has a similar configuration as the second metal layer M2. That is, the third metal layer M3 includes M3 logic circuitry 52 and third layer identification signal writing circuitry connections 50. Once again, changing the values generated by the signal writing circuitry connections 50 of the third metal layer is sufficient to change the value of the circuit identification number produced by the signal writing logic circuitry 40.

Figure 4:
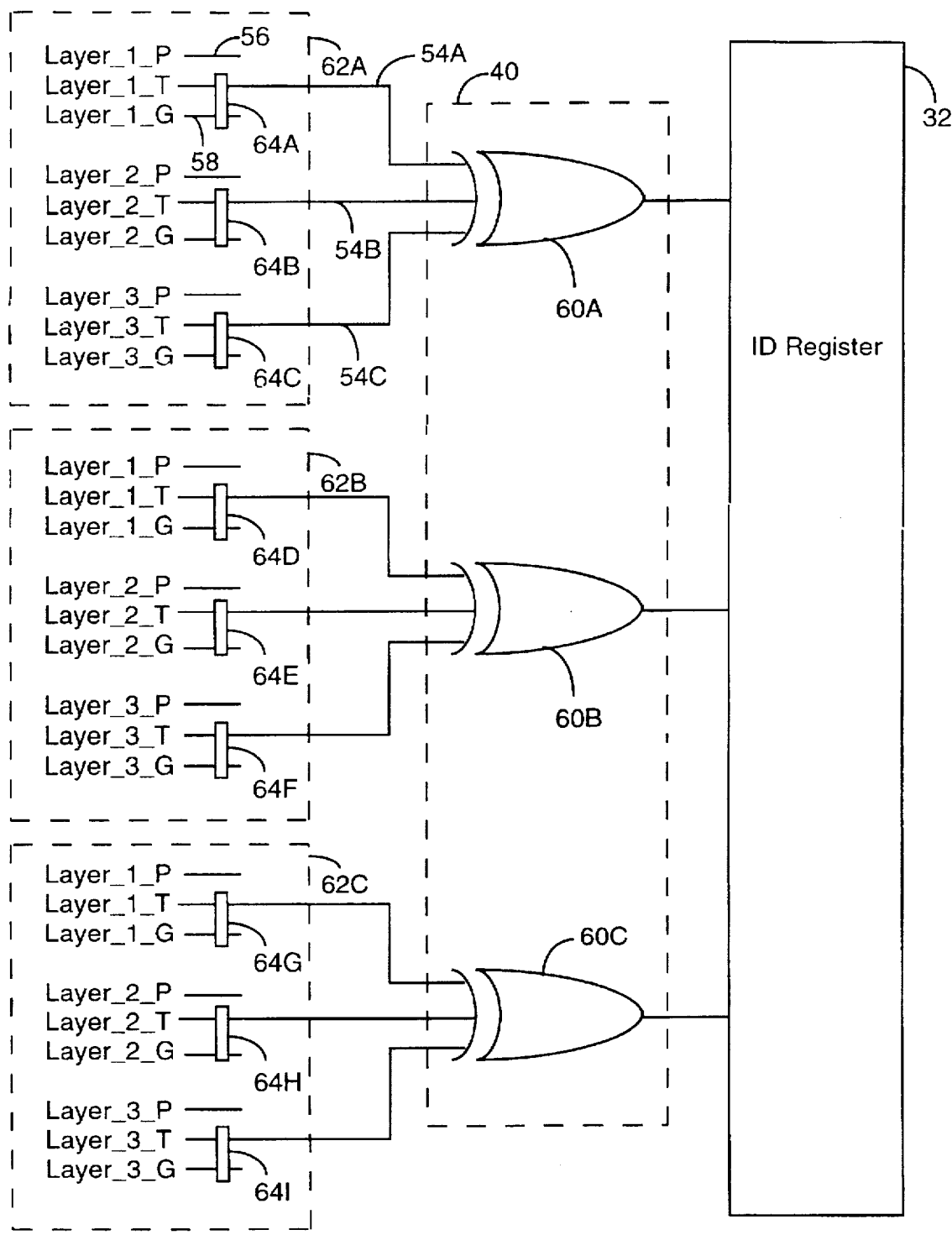
FIG. 4 illustrates multiple layer identification signal writing circuitry connected to a set of multiple layer identification signal writing circuitry connection units in accordance with one embodiment of the invention.

FIG. 4 illustrates a number of elements shown in FIG. 3. In particular, FIG. 4 illustrates a 3-bit identification register 32. The identification register 32 is connected to multiple layer identification signal writing logic circuitry 40. In this example, the logic circuitry 40 is implemented as a set of logical XOR gates 60A, 60B, and 60C. As known in the art, a logical XOR operation produces a digital ONE value if one of the input signals A or B, to the exclusion of the other, has a digital ONE value. That is, in a logical XOR operation the output is a digital ONE if an A input is a digital ONE or if a B input is a digital ONE, but not if both A and B are a digital ONE. The use of logical XOR gates in the present invention is ideal because the logical XOR function has the characteristic that the output signal can always be reversed by reversing the value of a single input.

In accordance with the invention, each logical XOR gate 60 receives N inputs, where N is the number of metal layers. Thus, in the example of FIGS. 3 and 4, there are three inputs to the XOR gate 60A. Each input to a XOR gate is generated from a different metal layer. The connections required to obtain signals from different metal layers for a single XOR gate 60A is shown as a multiple layer identification signal writing circuitry connection units 62A, 62B, 62C.

The signal writing circuitry connection unit 62A includes a first metal layer signal trace 54A, a second metal layer signal trace 54B, and a third metal layer signal trace 54C. The use of vias to route signals from different metal layers in an integrated circuit is well known. Thus, the routing of signals from the different metal layers to the identification signal writing logic circuitry 40 can be readily accomplished by those skilled in the art.

Each signal trace into the identification signal writing circuitry 40 is selectively connected to either a power line or a ground line. For example, as shown in FIG. 4, the first metal layer signal trace 54A has a connector 64A electrically coupling it to a first layer ground line 58 (Layer__1__G). This results in the first metal layer signal trace 54A carrying a digital ZERO signal. Alternately, the connector 64A may be used to electrically couple the first metal layer signal trace 54A to a first layer power line 56 (Layer__1__P) to produce a digital ONE signal. Similar connections are made at each metal layer.

Multiple signal traces must be provided at each metal layer. That is, at each metal layer, a signal trace must be provided for each bit value associated with a circuit identification number. In the example of the present invention, a three bit circuit identification number is presumed. In this case, three separate signal traces are required at each metal layer to provide inputs to the identification signal writing logic circuitry 40.

Figure 5:
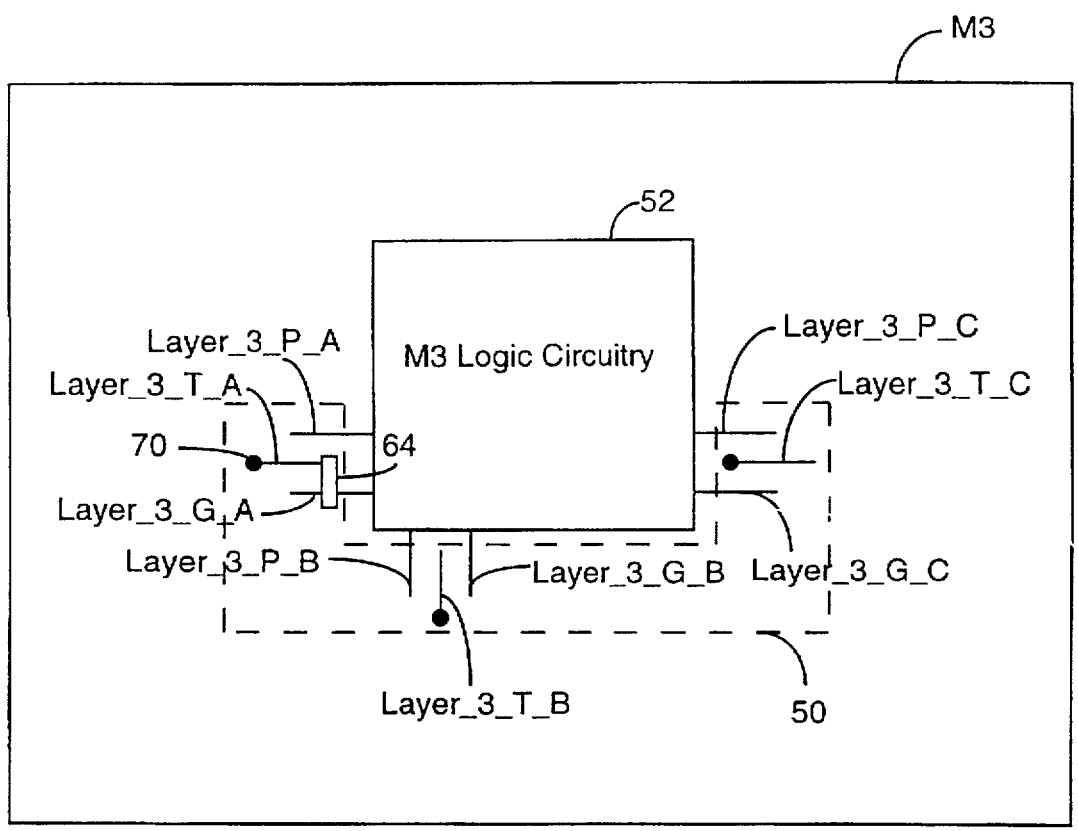
FIG. 5 illustrates third layer identification signal writing circuitry connections in accordance with one embodiment of the invention.

This feature of the invention is more fully appreciated with reference to FIG. 5. FIG. 5 illustrates the third metal layer M3. The third metal layer M3 includes three signal traces (Layer__3__T__A, Layer__3__T__B, and Layer__3__T__C). The "A", "B", "C" terms can be viewed as corresponding to the three logical XOR gates 60A, 60B, and 60C. Thus, the first signal trace (Layer__3__T__A) is routed to XOR gate 60A.

As shown in the figure, each signal trace terminates in a via 70, which is used to establish a connection to the second metal layer M2 and ultimately the first metal layer M1, where the identification signal writing circuitry 40 may be located.

In accordance with the invention, the first signal trace (Layer_3_T_A) is positioned proximate to a first power line (Layer_3_P_A) and a first ground line (Layer_3_G_A). This can be readily accomplished since the M3 logic circuitry 52 requires a plurality of such lines. This proximate positioning allows the first signal trace to be easily tied to either line with a connector 64. The connector 64 may be formed of any material that establishes an electrical connection with the fist signal trace (Layer_3_T_A). If the connector 64 is connected between the first power line (Layer 3 P A) and the first signal trace (Layer_3_T_A), then the first signal trace will carry a digital ONE signal to the identification signal writing logic circuitry 40. Conversely, if the connector 64 is connected between the first ground line (Layer_3_G_A) and the first signal trace (Layer_3_T_1), then the first signal trace will carry a digital ZERO signal to the identification signal writing logic circuitry 40.

FIG. 5 also illustrates a second signal trace (Layer_3_T_B) positioned between a second power line (Layer_3_P_B) and a second ground line (Layer_3_G_B). As in the previous example, a connector 64 is used to either generate a digital ONE or a digital ZERO on the second signal trace (Layer_3_T_B). The second signal trace (Layer_3_T_B) is shown as being positioned between different power and ground lines than the first signal trace. However, it should be noted that if the layout of the circuit is appropriate, the second signal trace (Layer_3_T_B) may be positioned such that it can be tied to either the first power line (Layer_3_P_A) or the first ground line (Layer_3_G_A).

FIG. 5 also illustrates a third signal trace (Layer_3_T_C) positioned between a third power line (Layer_3_P_C) and a third ground line (Layer_3_G_C). The connection technique for this trace is the same as in the previous examples.

The collection of connections shown in FIG. 5 constitute the third layer identification signal writing circuitry connections 50.

Figure 6:
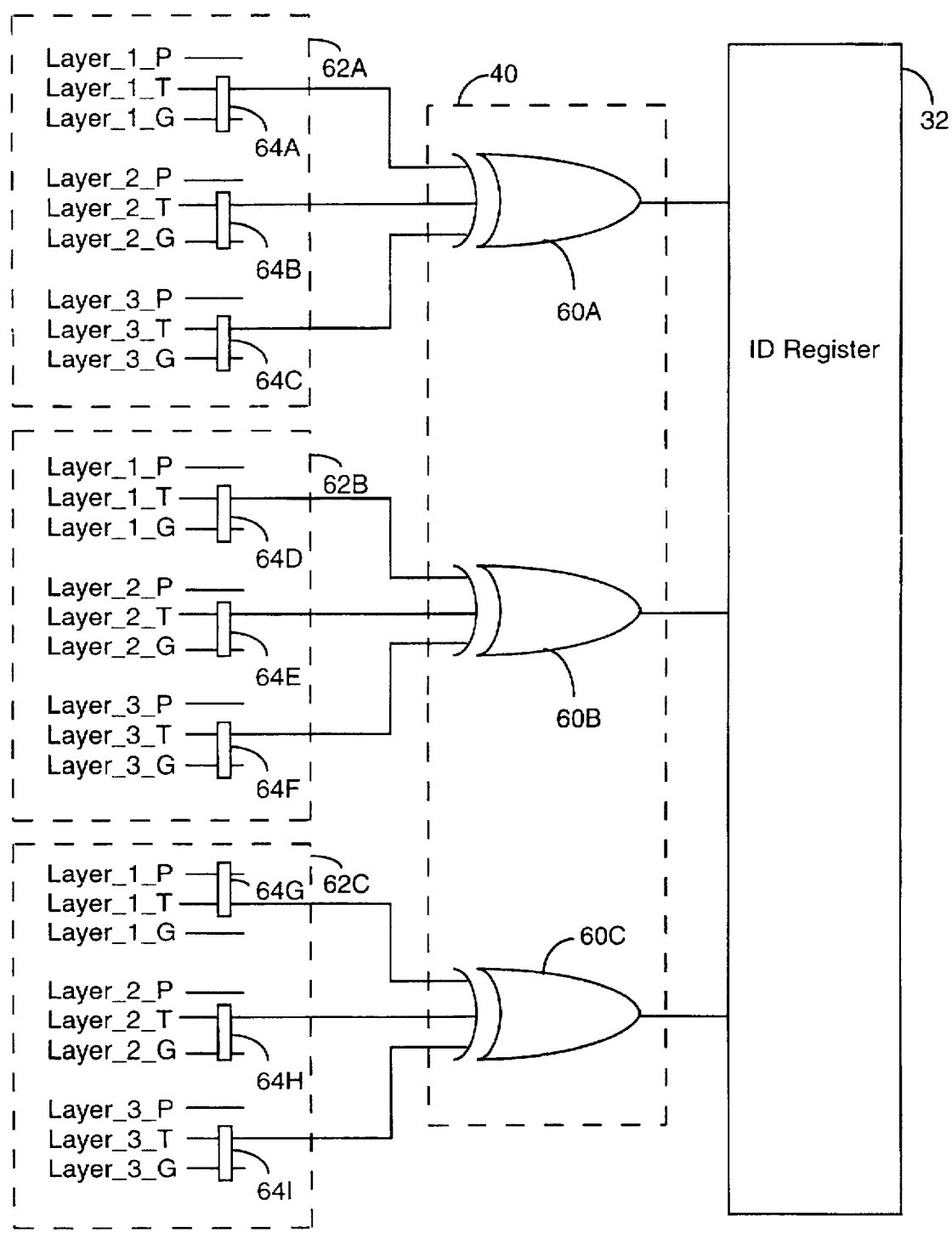
FIG. 6 illustrates the circuitry of FIG. 4 reconnected at a first metal layer to change the value of a circuit identification number.

Returning now to FIG. 4, it can be seen that each connector 64A-64I is tied to a ground line. As a result, all inputs to the identification signal writing logic circuitry 40 are low. Consequently, the three bit circuit identification number stored in the identification register 32 is zero, a digital value of 000. Suppose now that a revision is made on the first metal layer M1 of the integrated circuit 35. This revision must be reflected in the value of the circuit identification number. That is, the value of the circuit identification number should now be 1, a digital value of 001. To accomplish this in accordance with the invention, the connector 64G is moved from its original position between the layer one ground line (Layer_1_G) of block 62C to the layer one power line (Layer_1_P) of block 62C. This change in the first layer identification signal writing circuitry connections 42 is shown in FIG. 6. (Note that the first layer identification signal writing circuitry connections 42 include the Layer_1_P, Layer_1_T, Layer_1_G values in the three blocks 62A, 62B, and 62C).

The change in electrical connections shown in FIG. 6 results in the required digital value of 001 stored in the identification register 32. Note that this change in value was accomplished simply by moving a connector of the first metal layer.

Suppose now that modifications are required on the third metal layer M3. This necessitates a change in the circuit identification number from a value of 1 to 2, reflecting that two revisions have been made. The digital value for one is 001, while the digital value for two is 010. Note then that two bits in the identification register 32 must be changed to reflect the second version.

Figure 7:
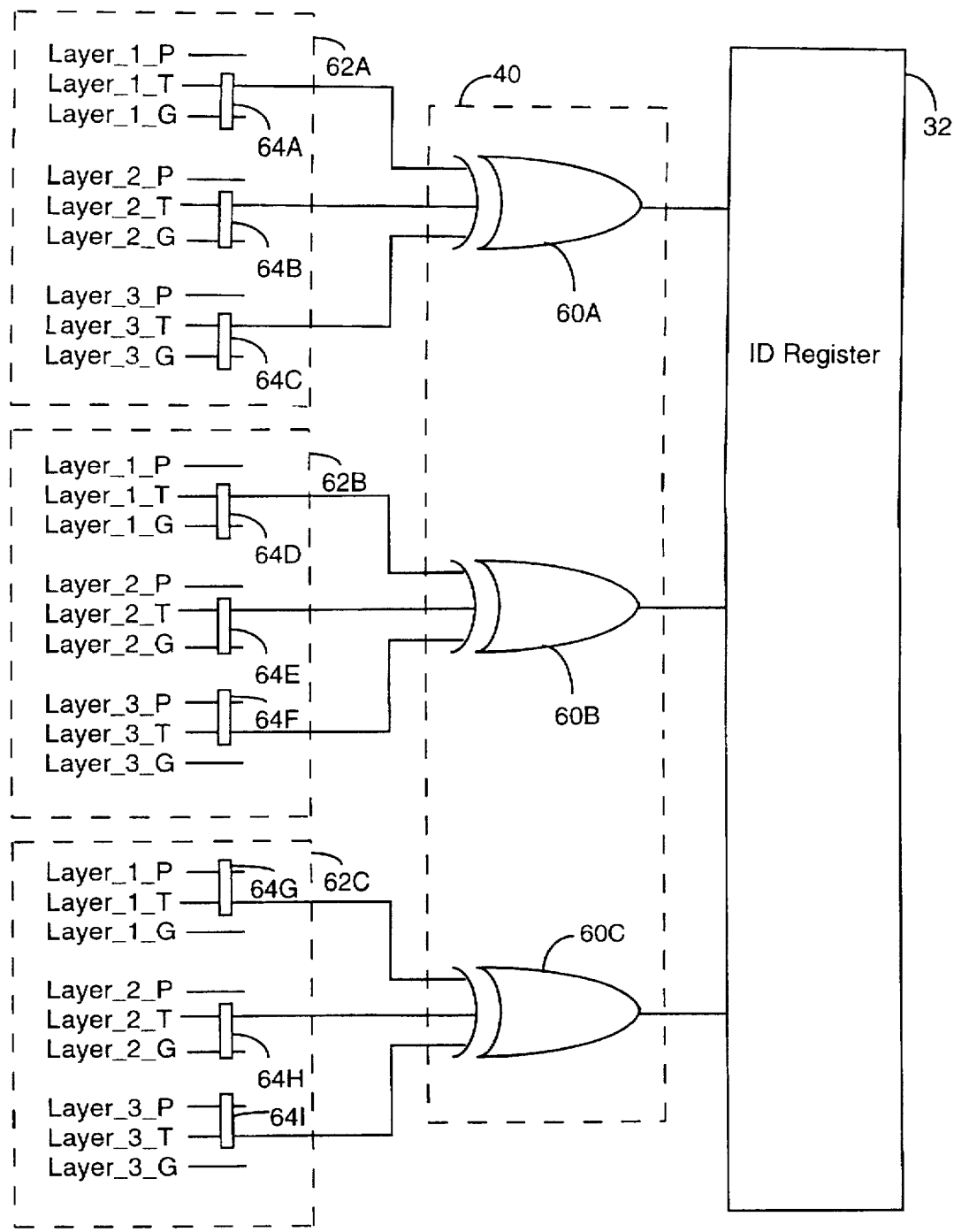
FIG. 7 illustrates the circuitry of FIG. 6 reconnected at a third metal layer to change the value of a circuit identification number.

As shown in FIG. 7, the required changes can be made solely by changing the third layer signal writing circuitry connections 50 (the Layer_3_P, Layer_3_T, and Layer_3_G values in the blocks 62A, 62B, and 62C). In particular, the required change can be made by moving the connector 64F of block 62B from the Layer_3_G ground trace to the Layer_3_P power trace, as shown in FIG. 7. By connecting the connector 64F to a power line, a digital ONE is applied to the XOR gate 60B, thereby producing a digital ONE output.

In addition, the connector 64I of block 62C is moved from the Layer_3_G ground trace to the Layer_3_P power trace. Note that the connector 64G was tied to a power line in the previous revision to produce a digital ONE input at XOR gate 60C. With the connector 64I now tied to a power line (Layer_3_P), there are two digital ONE inputs to the XOR gate 60C. Thus, the XOR gate 60C generates a digital ZERO output.

In sum, the output of XOR gate 60A remained at ZERO with this revision, the output of XOR gate 60B changed from ZERO to ONE, and the output of XOR gate 60C changed from ONE to ZERO, to provide the required digital value of 010, reflecting that a second revision has been performed.

Note how the XOR gate logic is exploited with the present invention. The output value of each XOR gate was reversed simply by reversing one of the input values to the XOR gate. For example, in FIG. 7, to change the output of XOR gate 60C from a digital ONE to a digital ZERO, the only input change required was to switch the connector 64I from a digital ZERO value at the third layer ground line (Layer_3_G) to a digital ONE value at the third layer power line (Layer_3_P). The same benefit can be exploited through the use of XNOR gates.

The foregoing descriptions of specific embodiments of the present invention are presented for purposes of illustration and description. They are not intended to be exhaustive or to limit the invention to the precise forms disclosed, obviously many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated. It is intended that the scope of the invention be defined by the following claims and their equivalents.

I claim:
1. An integrated circuit, comprising:
   a first metal layer with first layer identification signal writing circuitry connections to produce first metal layer circuit identification signals;
   a second metal layer with second layer identification signal writing circuitry connections to produce second metal layer circuit identification signals; and
   logic circuitry in said first metal layer with input connections to said first layer identification signal writing circuitry connections and said second layer identification signal writing circuitry connections, said logic circuitry combining said first metal layer circuit identification signals and said second metal layer circuit identification signals to produce a circuit identification number.

2. The integrated circuit of claim 1 wherein the value of said circuit identification number is specified by a selected configuration of said first layer identification signal writing circuitry connections.

3. The integrated circuit of claim 1 wherein the value of said circuit identification number is specified by a selected configuration of said second layer identification signal writing circuitry connections.

4. The integrated circuit of claim 1 wherein said first layer identification signal writing circuitry connections include a first set of signal traces to carry said first metal layer circuit identification signals, each of said signal traces being selectively connected to a power line or a ground line.

5. The integrated circuit of claim 4 wherein said second layer identification signal writing circuitry connections include a second set of signal traces to carry said second metal layer circuit identification signals, each of said second set of signal traces being selectively connected to a power line or a ground line.

6. The integrated circuit of claim 5 wherein said logic circuitry includes a set of logical XOR gates to process said first metal layer circuit identification signals and said second metal layer circuit identification signals.

7. The integrated circuit of claim 6 wherein each logical XOR gate of said set of logical XOR gates is connected to a first selected signal trace of said first set of signal traces and a second selected signal trace of said second set of signal traces.

8. The integrated circuit of claim 7 wherein each logical XOR gate generates a single bit value for said circuit identification number.

9. The integrated circuit of claim 1 further comprising an identification register to store said circuit identification number.

10. The integrated circuit of claim 1 positioned in a general purpose computer.

11. A method of constructing an integrated circuit, said method comprising the steps of:

providing a first metal layer with first layer identification signal writing circuitry connections to produce first metal layer circuit identification signals;

providing a second metal layer with second layer identification signal writing circuitry connections to produce second metal layer circuit identification signals; and providing logic circuitry in said first metal layer with input connections to said first layer identification signal writing circuitry connections and said second layer identification signal writing circuitry connections, said logic circuitry combining said first metal layer circuit identification signals and said second metal layer circuit identification signals to produce a circuit identification number.

12. The method of claim 11 further comprising the step of providing logical XOR gates for said logic circuitry.

13. The method of claim 12 further comprising the step of configuring each of said logical XOR gates to receive a selected signal of said first metal layer circuit identification signals and a selected signal of said second metal layer circuit identification signals.

14. The method of claim 13 further comprising the step of using each logical XOR gate to generate a single bit value of said circuit identification number.

15. The method of claim 14 further comprising the step of storing said circuit identification number in an identification register.

16. A method of generating a circuit identification number, said method comprising the steps of:

selectively attaching a first set of signal traces on a first metal layer to power and ground lines of said first metal layer to generate first metal layer circuit identification signals;

selectively connecting a second set of signal traces on a second metal layer to power and ground lines of said second metal layer to generate second metal layer circuit identification signals; and combining said first metal layer circuit identification signals and said second metal layer circuit identification signals to produce a circuit identification number.

17. The method of claim 16 wherein said combining step includes the step of combining a first selected signal trace of said first set of signal traces with a first selected signal trace of said second set of signal traces to form a first bit value of said circuit identification number.

18. The method of claim 17 wherein said combining step includes the step of combining a second selected signal trace of said first set of signal traces with a second selected signal trace of said second set of signal traces to form a second bit value of said circuit identification number.

19. The method of claim 16 wherein said combining step includes the step of using a logical XOR operation to combine said first metal layer circuit identification signals and said second metal layer circuit identification signals.

20. The method of claim 16 further comprising the step of storing said circuit identification number in an identification register.

\* \* \* \* \*